(12) United States Patent
Li et al.

(10) Patent No.: US 10,128,368 B2
(45) Date of Patent: Nov. 13, 2018

(54) DOUBLE GATE TRENCH POWER TRANSISTOR AND MANUFACTURING METHOD THEREOF

(71) Applicant: SINOPOWER SEMICONDUCTOR, INC., Hsinchu (TW)

(72) Inventors: Po-Hsien Li, Tainan (TW); Jia-Fu Lin, Yilan County (TW); Chia-Cheng Chen, Taoyuan (TW); Wei-Chieh Lin, Hsinchu (TW)

(73) Assignee: SINOPOWER SEMICONDUCTOR, INC., Hsinchu (TW)

( * ) Notice: Subject to any disclaimer, the term of this patent is extended or adjusted under 35 U.S.C. 154(b) by 221 days.

(21) Appl. No.: 14/994,250

(22) Filed: Jan. 13, 2016

(65) Prior Publication Data

US 2017/0200822 A1    Jul. 13, 2017

(51) Int. Cl.
*H01L 29/78* (2006.01)
*H01L 29/40* (2006.01)
*H01L 29/10* (2006.01)
*H01L 29/66* (2006.01)

(52) U.S. Cl.
CPC ...... *H01L 29/7813* (2013.01); *H01L 29/1095* (2013.01); *H01L 29/407* (2013.01); *H01L 29/66484* (2013.01); *H01L 29/66734* (2013.01); *H01L 29/7831* (2013.01)

(58) Field of Classification Search
CPC ............... H01L 29/7813; H01L 29/407; H01L 29/1095; H01L 29/66734; H01L 29/66484; H01L 29/4236
See application file for complete search history.

(56) References Cited

U.S. PATENT DOCUMENTS

| 9,391,194 | B1 * | 7/2016 | Fukunaga | H01L 29/7813 |
| 2005/0236664 | A1 * | 10/2005 | Aoki | H01L 29/66348 257/330 |
| 2007/0138547 | A1 * | 6/2007 | Nakamura | H01L 29/66719 257/331 |
| 2009/0053869 | A1 * | 2/2009 | Hirler | H01L 21/2815 438/270 |
| 2010/0244117 | A1 * | 9/2010 | Prall | G11C 11/5692 257/316 |
| 2012/0061723 | A1 * | 3/2012 | Ishii | H01L 29/407 257/139 |

(Continued)

*Primary Examiner* — Joseph C Nicely
(74) *Attorney, Agent, or Firm* — Li & Cai Intellectual Property (USA) Office

(57) ABSTRACT

A double gate trench power transistor and manufacturing method thereof are provided. The double gate trench power transistor gate structure includes an epitaxial layer, a trench structure formed in the epitaxial layer, at least two gate structures, and a shielding electrode structure. The trench structure includes a deep trench portion and two shallow trench portions respectively adjacent to two opposite sides of the deep trench portion. Each of the gate structures formed in each of the shallow trench portions includes a gate insulating layer and a gate electrode. The gate insulating layer has a first dielectric layer, a second dielectric layer and a third dielectric layer. The second dielectric layer is interposed between the first and third dielectric layers. Additionally, a portion of the gate insulating layer is in contact with a shielding dielectric layer of the shielding electrode structure.

8 Claims, 10 Drawing Sheets

(56) References Cited

U.S. PATENT DOCUMENTS

| | | | |
|---|---|---|---|
| 2013/0062688 A1* | 3/2013 | Kobayashi | H01L 29/407 257/330 |
| 2014/0077278 A1* | 3/2014 | Nozu | H01L 29/407 257/288 |
| 2015/0137223 A1* | 5/2015 | Siemieniec | H01L 29/7813 257/331 |
| 2016/0049486 A1* | 2/2016 | Blank | H01L 21/3083 257/330 |
| 2016/0155840 A1* | 6/2016 | Lemke | H01L 29/7813 257/334 |
| 2017/0110535 A1* | 4/2017 | Yilmaz | H01L 21/2253 |
| 2017/0194485 A1* | 7/2017 | Smith | H01L 29/7813 |
| 2017/0263768 A1* | 9/2017 | Katoh | H01L 29/7827 |
| 2017/0373139 A1* | 12/2017 | Ding | H01L 29/4236 |

* cited by examiner

DOUBLE GATE TRENCH POWER TRANSISTOR AND MANUFACTURING METHOD THEREOF

BACKGROUND

1. Technical Field

The present disclosure relates to a power metal oxide semiconductor field effect transistor, in particular, to a double gate trench power transistor.

2. Description of Related Art

Power Metal Oxide Semiconductor Field Transistor (Power MOSFET) is widely used as a switch element of electrical devices such as a power supply, rectifier or low pressure motor controller, etc. Most of the existing power metal oxide semiconductor field transistors adopt vertical structure design to increase the component density. These power metal oxide semiconductor field transistors having vertical structure design also refer to double gate power metal oxide semiconductor field transistors, and the advantage thereof is that it would be able to control the voltage for operating the element under low power consumption.

The parameters that affect the element properties of the power metal oxide semiconductor field transistors include the source/drain on-resistance (Rdson), breakdown voltage and switching speed, etc. However, regarding the power metal oxide semiconductor field transistors, the source/drain on-resistance (Rdson) and the breakdown voltage are in positive correlation. In other words, while increasing the doping concentration of the drift region or reducing the thickness of the drift region for reducing the source/drain on-resistance (Rdson), the breakdown voltage would be reduced as well.

Therefore, in order to maintain higher breakdown voltage of the power metal oxide semiconductor field transistors under relatively low source-drain on-resistance, the trend is to form a shielding electrode structure in the gate trench that extends into the drift region.

In some of the structures of the power metal oxide semiconductor field transistor, two gate electrodes and a shielding electrode parallel are arranged in the same trench and electrical insulated by an oxide layer. Furthermore, the shielding electrode is positioned between the two gate electrodes and extends into the drift region through the surface of the epitaxial layer.

However, during the manufacture of the above power metal oxide semiconductor field transistor, the step of forming the gate oxide layer and the step of forming the insulating layer for isolating the gate electrodes and the shielding electrodes are performed in the same process, therefore, the thickness of the insulating layer between the gate electrodes and the shielding electrode is relatively small, thereby increasing the resistance between the gate and the source.

Furthermore, subjected to the limitation of the process conditions, the bottom oxide layer is hard to deposit and is relatively thin, especially the side close to the shielding electrode at the bottom of the gate electrode. Therefore, the point potential effect easily occurs, thereby reducing the withstand voltage of the gate and inducing the degradation of the gate under high temperature. Accordingly, the reliability of the power metal oxide semiconductor field transistor would decrease thereby affecting the lifetime of the power metal oxide semiconductor field transistor.

SUMMARY

The instant disclosure provides a double gate trench power transistor and the manufacturing method thereof, in which after completing the process of forming the gate electrode in the shallow trench portions, the deep trench portion is formed by performing an etching step. Furthermore, in the process of forming the deep trench portion, utilizing a nitride layer in the gate insulating layer as a lateral hard mask may avoid the gate electrode formed in the shallow trench portion being etched.

An embodiment of the instant disclosure provides a double gate trench power transistor comprising a substrate, an epitaxial layer, two gate structures, a shielding electrode structure, a body region and a source region. The epitaxial layer forms on the substrate, in which the epitaxial layer defines at least an active region and has a trench structure formed in the active region, and the trench structure comprises a deep trench portion and two shallow trench portions adjacent to two opposite sides of the deep trench portion respectively. Two gate structures are formed in the shallow trench portions respectively, in which each gate structure comprises a gate insulating layer and a gate electrode, the gate insulating layer conformingly covers an inner wall surface of the corresponding shallow trench portion to insulate the gate electrode from the epitaxial layer, and the gate insulating layer comprises a first dielectric layer, a second dielectric layer and a third dielectric layer, the second dielectric layer is interposed between the first dielectric layer and the third dielectric layer. The shielding electrode structure forms in the deep trench portion, the shielding electrode structure comprises a shielding dielectric layer and a shielding electrode, the shielding dielectric layer conformingly covers an inner wall surface of the deep trench portion to insulate the shielding electrode from the epitaxial layer, and a part of the shielding dielectric layer positioned at two opposite sides of the shielding electrode contacts the gate insulating layers positioned in the shallow trench portions. The body region forms in the epitaxial layer and surrounding the gate structures. The source region forms above the body region.

Another embodiment of the instant disclosure provides a manufacturing method of a double gate trench power transistor comprising the following steps: first, providing a substrate and forming an epitaxial layer on the substrate, in which the epitaxial layer defines an active region. Next, forming a plurality of shallow trenches in the epitaxial layer, in which the shallow trenches are located in the active region. Subsequently, forming an insulating layer and a gate electrode in each shallow trench, in which the insulating layer conformingly covers an inner wall surface of the corresponding shallow trench and comprises a first dielectric layer, a second dielectric layer and a third dielectric layer, in which the second dielectric layer is interposed between the first dielectric layer and the third dielectric layer. Performing an etching step to form a plurality of deep trenches in the epitaxial layer, in which each deep trench is immediately adjacent to at least one of the shallow trenches, and while performing the etching step, the second dielectric layer serves as a lateral hard mask. After that, forming a shielding dielectric layer and a shielding electrode in each deep trench, in which the shielding dielectric layer conformingly covers an inner wall surface of the corresponding deep trench and isolates the shielding electrode from the epitaxial layer, and the shielding dielectric layer contacts the second dielectric layer. Subsequently, performing a body doping process on the epitaxial layer to form a body region. Next, performing a source doping process to form a source region, in which the source region is above the body region.

To sum up, in the double gate trench power transistor and the manufacturing method thereof provided by the instant disclosure, the gate electrode and the shielding electrode are isolated from each other by the thicker shielding dielectric layer and a part of the gate insulating layer, and hence, the capacitance generated between the gate electrode and the shielding electrode may be reduced. In addition, in the manufacturing process provided by the embodiment of the instant disclosure, the gate electrode is less likely to form a point portion that would accumulate electric charges, thereby improving the electrical performance of the double gate trench power transistor.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Figure 1A:
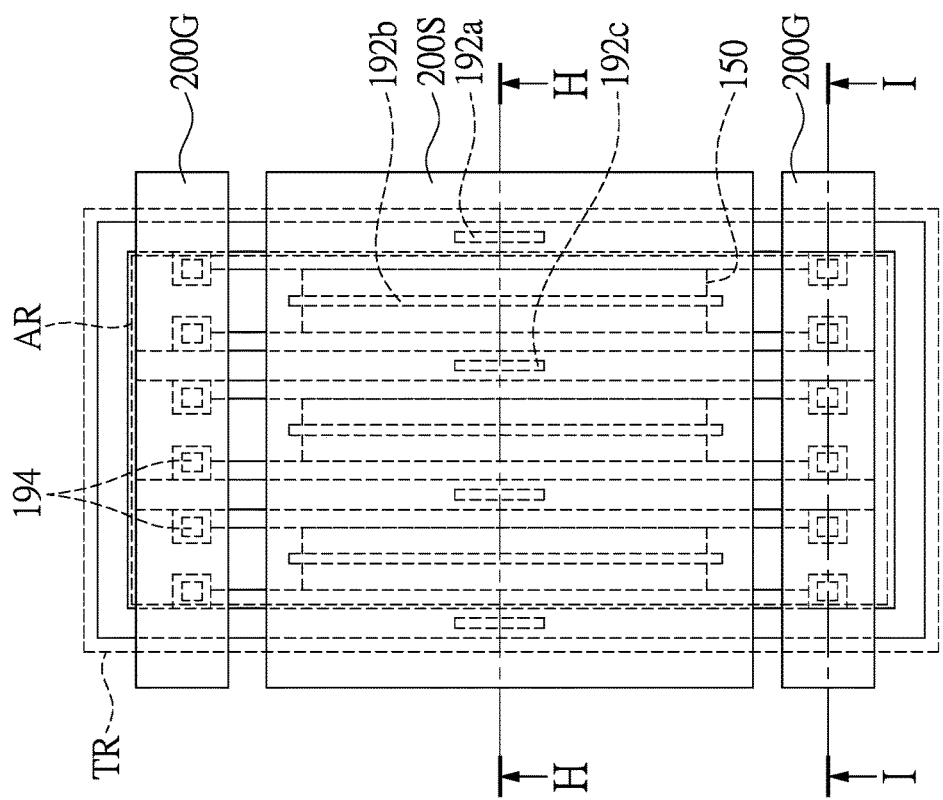
FIG. 1A is a top schematic view of a double gate trench power transistor of an embodiment of the instant disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

Figure 1B:
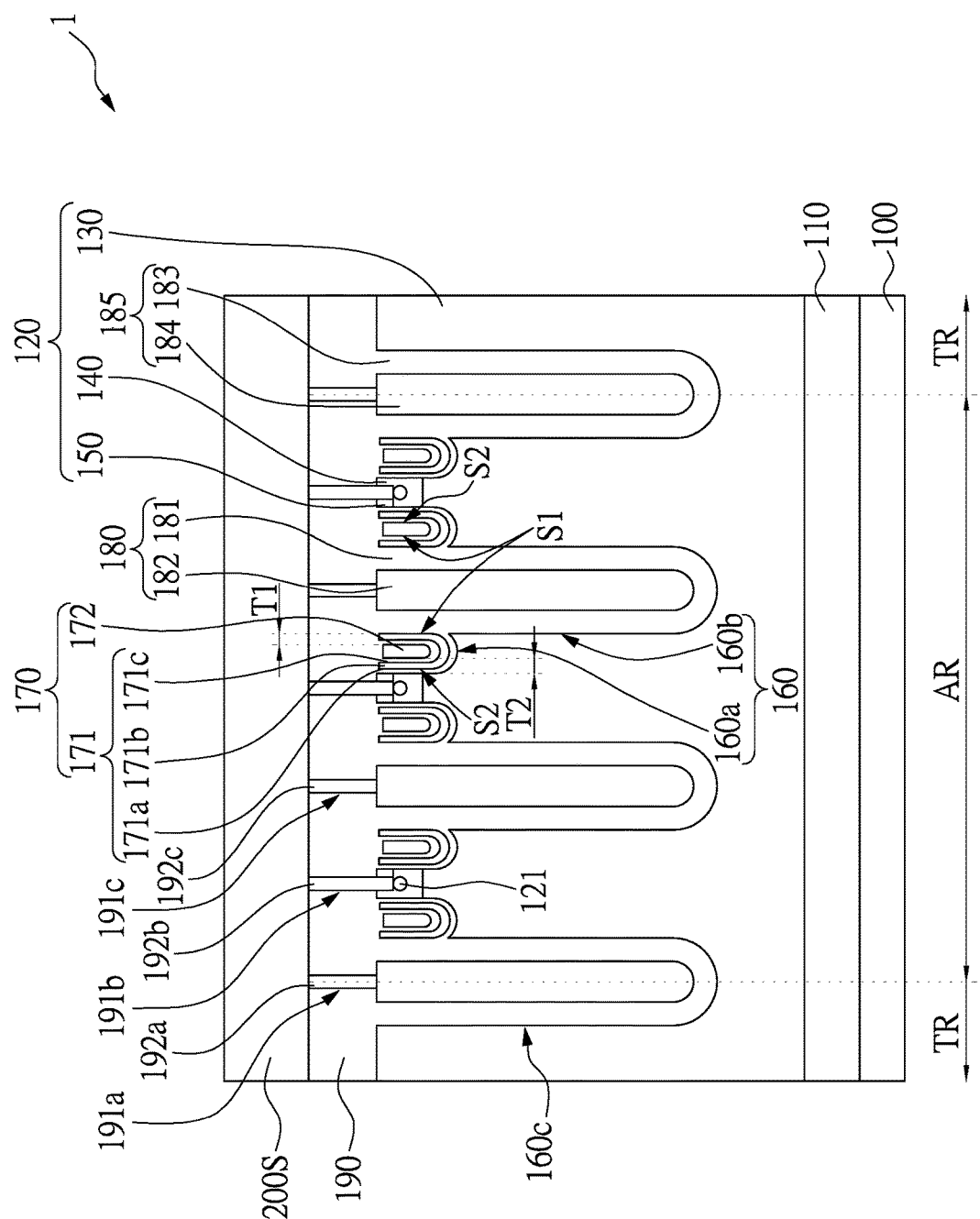
FIG. 1B is a sectional schematic view taken along the H-H sectioning line of FIG. 1A.
Figure 1C:
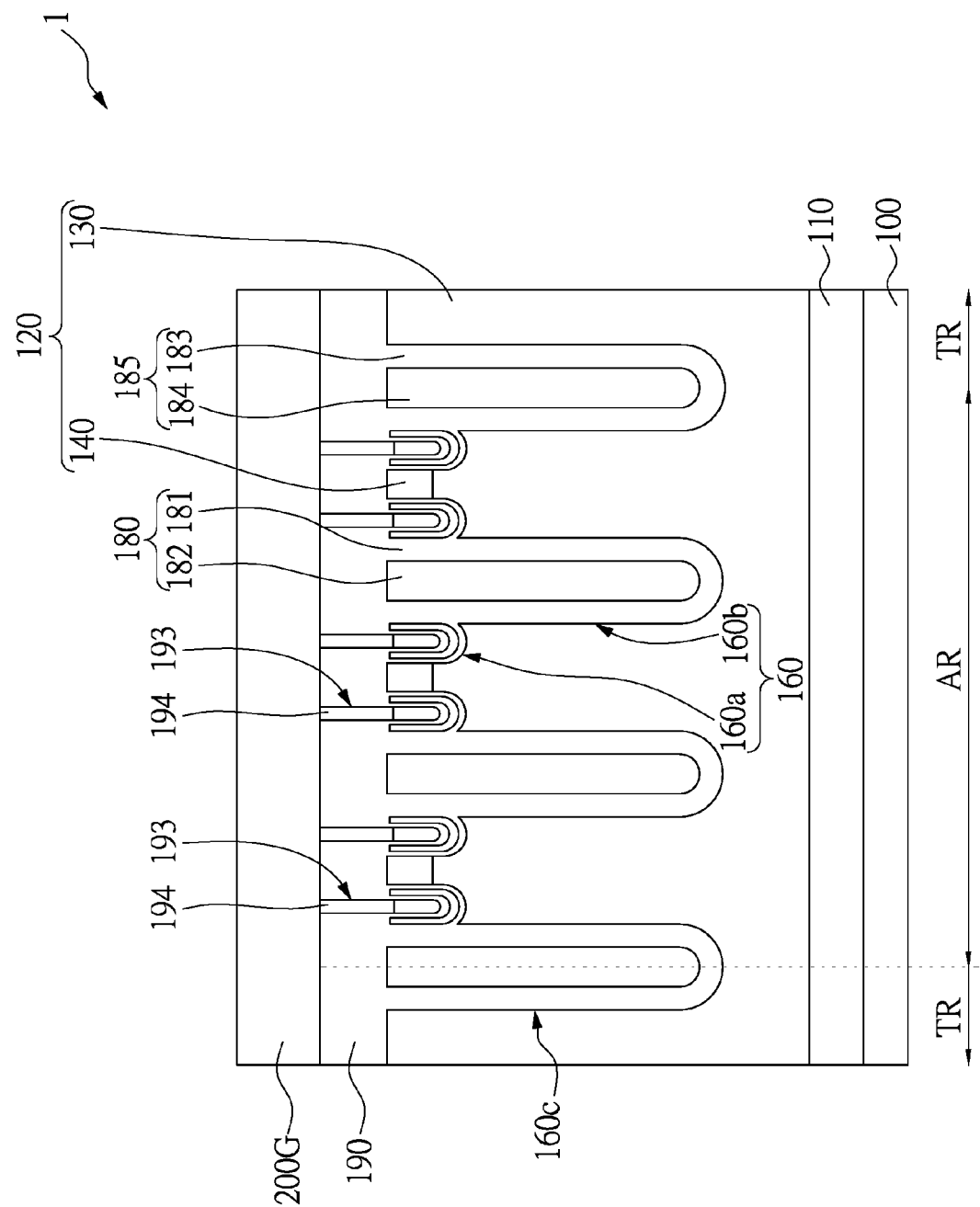
FIG. 1C is a sectional schematic view taken along the I-I sectioning line of FIG. 1A.

Please refer to FIG. 1A to FIG. 1C. FIG. 1A is a top schematic view of a double gate trench power transistor of an embodiment of the instant disclosure. FIG. 1B is a sectional schematic view taken along the H-H sectioning line of FIG. 1A. FIG. 1C is a sectional schematic view taken along the I-I sectioning line of FIG. 1A.

First, please refer to FIG. 1B. The double gate trench power transistor 1 comprises a substrate 100, an epitaxial layer 120, at least two gate structures 170, a shielding electrode structure 180, a body region 140 and a source region 150.

In FIG. 1, the substrate 100 has a high concentration of a first type conductive dopant for forming a first heavy doping region. The first heavy doping region serves as the drain of a trench power transistor, and may be distributed at partial region of the substrate 100 or all over the entire substrate 100. In the present embodiment, the first heavy region is distributed in the entire substrate 100. However, the instant disclosure is not limited thereto. The first conductive dopant may be an N-type or a P-type conductive dopant. Assuming that the substrate 100 is a silicon substrate, N-type dopant is an ion having five valence electrons, such as a phosphorus ion or an arsenic ion, and the P-type dopant is an ion having three valence electrons, such as a boron ion, aluminum ion or gallium ion.

If the trench power transistor is an N-type transistor, the substrate 100 is doped with N-type conductive dopant. On the other hand, if the trench power transistor is a P-type transistor, the substrate 100 is doped with P-type dopant. In the present embodiment, the trench power transistor is an N-type transistor.

The epitaxial layer 120 is formed on the substrate 100 and has a first type conductive dopant with low concentration. In other words, taking an NMOS transistor as an example, the substrate 100 is N-doped with high concentration ($N^+$), and the epitaxial layer 120 is N-doped with low concentration ($N^-$). In contrast thereto, taking a PMOS transistor as an example, the substrate 100 is P-doped with high concentration ($P^+$ doping), and the epitaxial layer 120 is P-doped in low concentration ($P^-$ doping).

In the present embodiment, the double gate trench power transistor 1 further comprises a buffer layer 110 formed between the epitaxial layer 120 and the substrate 100. The buffer layer 110, the substrate 100 and the epitaxial layer 120 have the same conductive type, i.e., the buffer layer 110 is doped with the first type conductive dopant as well. It is worthwhile to mention that the doping concentration of the buffer layer 110 is between the doping concentration of the substrate 100 and the doping concentration of the epitaxial layer 120. By forming the buffer layer 110 between the substrate 100 and the epitaxial layer 120, it would be able to reduce the on state source/drain resistance (Rdson), thereby reducing the power consumption of the double gate trench power transistor 1.

In addition, by doping different concentrations of different types of dopants in different regions, the epitaxial layer 120 may be divided into a drift region 130, the body region 140 and the source region 150. The body region 140 and the source region 150 are formed in the epitaxial layer 120 at the side of the trench structure 160, and the drift region 130 is formed in the epitaxial layer 120 at the side near to the substrate 100. In other words, the body region 140 and the source region 150 are formed at the upper portion of the epitaxial layer 120, and the drift region 130 is formed in the lower portion of the epitaxial layer 120.

Specifically, the body region 140 is formed by doping a second conductive dopant in the epitaxial layer 120 and the source region 150 is formed by doping a high concentration of the first type conductive dopant in the body region 140, and the source region 150 is formed in the upper portion of the body region 140. For example, regarding an NMOS transistor, the body region 140 is P-doped (such as a P-well), and the source region 150 is N-doped. In addition, the doping concentration of the body region 140 is less than the doping concentration of the source region 150.

Please refer to FIG. 1A and FIG. 1B. In the present embodiment, the epitaxial layer 120 has defined an active region AR and a termination region TR surrounded the active region AR therein. The body region 140 is formed in the active region AR and the termination region TR, and the source region 150 is only formed in the active region AR. The epitaxial layer 120 has at least a trench structure 160 formed in the active region AR, and a terminal trench 160c formed in the termination region TR. Please refer to 1A, as shown in the top view, the terminal trench 160c surrounds the active region AR and is substantially in a circular shape.

In addition, please refer to FIG. 1B, the trench structure 160 of the embodiment of the instant disclosure has a deep trench portion 160b and two shallow trench portions 160a adjacent to the two opposite sides of the deep trench 160b respectively. In other words, the deep trench portion 160b is formed between the two shallow trench portions 160a, and the deep trench portion 160b is extended from the surface of the epitaxial layer 120 downward to a position below the body region 140, i.e., into the drift region 130, and the bottom of the deep trench portion 160b is closer to the substrate 100. The shallow trench portions 160a are also extended from the surface of the epitaxial layer 120 downward to a position below the body region 140, but the bottom of the shallow trench portions 160a is far from the substrate 100.

In the embodiment of the instant disclosure, at least two gate structures 170 are formed in the corresponding shallow trench portion 160a. The gate structure 170 has a gate insulating layer 171 and a gate electrode 172, in which the gate insulating layer 171 conformingly covers the inner wall of the corresponding shallow trench portion 160a to insulate the gate electrode 172 from the epitaxial layer 120. The inner wall comprises the bottom surface of the shallow trench portions 160a and the side wall surface of one of the sides far from the deep trench portion 160b.

The gate electrode 172 is formed in a recess defined by the gate insulating layer 171 in the shallow trench portions 160a. In a practical embodiment, the gate electrode 172 may be formed by heavily-doped polycrystalline silicon. However, the instant disclosure is not limited thereto.

To be specific, the gate insulating layer 171 comprises a first dielectric layer 171a, a second dielectric layer 171b and a third dielectric layer 171c. In the present embodiment, sequentially, in the direction from the inner wall near to the shallow trench portion 160a to the gate electrode 172, there are the first dielectric layer 171a, the second dielectric layer 171b and the third dielectric layer 171c, in which at least part of the second dielectric layer 171b is interposed between the first dielectric layer 171a and the third dielectric layer 171c.

In an embodiment, the dielectric constant of the second dielectric layer 171b is larger than the dielectric constant of the first dielectric layer 171a. Therefore, the first dielectric layer 171a and the second dielectric layer 171b are formed by different materials, but the first dielectric layer 171a and the third dielectric layer 171c may be formed by the same or a different material. For instance, the first dielectric layer 171a and the third dielectric layer 171c may be formed by oxides such as silicon oxide, and the second dielectric layer 171b may be formed by nitrides such as silicon nitride, or another material with high dielectric constant, such as hafnium oxide, yttrium oxide or alumina.

Therefore, compared to the gate insulating layer only made from an oxide layer, using the same thickness, the gate insulating layer of the embodiment which comprises the first to third dielectric layer 171a~171c formed in the side of the shallow trench portions 160a far from the deep trench portion 160b can have higher capacitance, referring to gate-to-channel capacitance (Cgs). It is worthwhile to mention that when a voltage is applied to the gate electrode 172 thereby inducing the body region 140 to form an inversion channel, the gate-to-channel capacitance is in inverse proportion with the inversion channel capacitance (Rch). Therefore, when the gate-to-channel capacitance increases, the inversion channel capacitance would decrease. Since the inversion channel capacitance is proportional to the source/drain on-resistance, when the inversion channel capacitance decreases, the source/drain on-resistance of the double gate trench power transistor 1 would be reduced.

Furthermore, in another embodiment, the second dielectric layer 171b can be a nitride layer and may serve as a lateral hard mask in the process of forming the deep trench portion 160b to avoid the gate electrode 172 from being etched. However, the material for forming the first to third dielectric layers 171a~171c may be chosen from various insulating materials according to the actual need for achieving the above results, and the instant disclosure is not limited thereto.

It is worthwhile to mention that a part of the first dielectric layer 171a immediately near to the deep trench portion 160b may be partially removed during the process for forming the deep trench portion 160b. The process for forming the double gate trench power transistor 1 and the effects resulting from the first dielectric layer 171a and the second dielectric layer 171b are described in detailed below.

If defining the side immediately near to the deep trench portion 160b as a first side S1, and defining the side far from the deep trench portion 160b as a second side S2, the gate insulating layer 171 contacting the first side S1 only comprises the second dielectric layer 171b and the third dielectric layer 171c. In other words, the thickness T1 of the gate insulating layer 171 that contacts the first side S1 would be smaller than the thickness T2 of the gate insulating layer 171 that contacts the second side S2.

In the present embodiment, the total thickness of the first dielectric layer 171a and the second dielectric layer is set based on withstanding the voltage of the double gate trench power transistor 1 (about 20 to 25V). In an embodiment, the total thickness of the first dielectric layer 171a and the second dielectric layer 171b is from 30 to 65 nm. To be specific, the thickness of the first dielectric layer 171a is from 10 to 35 nm, the thickness of the second dielectric layer 171b is from 20 to 30 nm, and the thickness of the third dielectric layer is from 7 to 10 nm.

The shielding electrode structure 180 is formed in the deep trench portion 160b and comprises a shielding dielectric layer 181 and a shielding electrode 182. The shielding electrode 182 formed in the deep trench portion 160b is extended downward from a position near to the surface of the epitaxial layer 120 and passes the horizontal position of the bottom of the gate electrode 172.

The shielding dielectric layer 181 conformingly covers the inner wall of the deep trench 160b to insulate the shielding electrode 182 from the epitaxial layer 120. In addition, a part of the dielectric layer 181 formed on the two opposite sides of the shielding electrode 182 contacts with the gate insulating layer 171 formed in the shallow trench portion 160a. Furthermore, a part of the shielding layer 181 directly contacts the second dielectric layer 171b.

In other words, in the embodiment of the instant disclosure, the shielding electrode 182 and the gate electrode 172 are isolated from each other through the shielding dielectric layer 181 and the gate insulating layer 171 formed at the first side S1 of the gate electrode 172, thereby ensuring the shielding electrode 182 and the gate electrode 172 are separated by a longer distance. Therefore, it is able to further reduce the gate/source capacitance (Cgs) formed between the shielding electrode 182 and the gate electrode 172 and reduce the switching loss.

In an embodiment, the shielding dielectric layer 181 may be made from oxides, nitrides or other insulating materials, and the shielding electrode 182 may be made from heavily doped polycrystalline silicon. However, the materials for forming the shielding dielectric layer 181 and the shielding electrode 182 in the instant disclosure are not limited thereto.

In addition, it is worthwhile to mention that in the embodiment of the instant disclosure, by positioning the shielding electrode 182 that is electrically connected to the source in the deep trench portion 160b, the charge balance in the drift region 130 may be achieved, and hence, the breakdown voltage may be increased. Therefore, the doping concentration of the drift region 130 may be relatively increased to reduce the source/drain conductive resistance.

Please refer to FIG. 1A and FIG. 1B. The double gate trench power transistor 1 of the embodiment of the instant disclosure further comprises a terminal electrode structure 185 formed in the terminal trench 160c, the terminal electrode structure 185 comprises a terminal electrode 184 and a terminal dielectric layer 183. The terminal electrode 184 is located in the terminal trench 160c and surrounds the active region AR. The terminal dielectric layer 183 conformingly covers the inner wall of the terminal trench 160c to insulate the terminal electrode 184 from the epitaxial layer 120.

In an embodiment, the material for forming the terminal dielectric layer 183 may be selected from oxides or nitrides, and the instant disclosure is not limited thereto. In the present embodiment, the terminal electrode 184 is electrically connected to the source and may increase the breakdown voltage of the double gate trench power transistor 1 element.

Please refer to FIG. 1A to FIG. 1C, the double gate trench power transistor 1 of the embodiment of the instant disclosure further comprises an interlayer dielectric layer 190, a plurality of first conductive plugs 192a~192c, a plurality of conductive plugs 194, a source conductive layer 200S and a gate conductive layer 200G.

The interlayer dielectric layer 190 is formed on the epitaxial layer 120, and the interlayer dielectric layer 190 may be made from materials such as boron phosphorus silicon glass (BPSG), phosphorus silicon glass (PSG), oxides, nitrides and the combination thereof. In addition, the interlayer dielectric layer 190 has a plurality of first contact openings 191a~191c (as shown in FIG. 1B), and a plurality of second contact openings 193 (as shown in FIG. 1C).

Please refer to FIG. 1A and FIG. 1B. In the present embodiment, a part of the first contact opening 191a is extended from the upper surface of the interlayer dielectric layer 190 to the terminal electrode 184 in the termination region TR.

The other part of the first contact opening 191b is extended from the interlayer dielectric layer 190 to a part of the epitaxial layer 120 in the active region AR, and is formed in one side of the source region 150. Furthermore, the epitaxial layer 120 further comprises a contact doping region 121, and the contact doping region 121 is right under the bottom of the first contact opening 191b. In an embodiment, the contact doping region 121 is formed by implanting boron difluoride ($BF_2$) in the epitaxial layer 120 through the first contact opening 191b.

However, the position of the first contact opening 191b may be changed based on the design of the element and is not limited by the embodiment of the instant disclosure. In other embodiments, the first contact opening 191b may directly correspond to the position of the source region 150 and be formed above of the source region 150. Another part of the first contact opening 191c extends from the upper surface of the interlayer dielectric layer 190 into the shielding electrode 182 in the active region AR.

A plurality of first conductive plugs 192a~192c are formed in the first contact openings 191a~191c respectively to electrically connect to the terminal electrode 184, the source region 150 and the shielding electrode 182 respectively. To be specific, the first conductive plug 192a forms in the first contact opening 191a, and forms an ohmic contact with the terminal electrode 184. Similarly, the first conductive plug 192c forms in the first contact opening 191c to form an ohmic contact with the shielding electrode 182. Furthermore, the first conductive plugs 192b form in the first contact openings 191b and directly contact the source region 150 in the epitaxial layer 120 and the doping region 121, thereby forming an ohmic contact between the first conductive plugs 191b and source region 150.

Please refer to FIG. 1C. A plurality of second contact openings 193 extend from the surface of the interlayer dielectric layer 190 to the gate electrode 172 in the active region AR. A plurality of second conductive plugs 194 are formed in the second contact openings 193 respectively to form ohmic contacts with the above first conductive plugs. The materials for forming the first conductive plugs 191a~191c and the second conductive plugs 194 may be, but are not limited to metals such as tungsten, copper, nickel or aluminum.

Please refer to FIG. 1A to FIG. 1C. The source conductive layer 200S and the gate conductive layer 200G cover the interlayer dielectric layer 190, in which the source conductive layer 200S electrically connects to the terminal electrode 184, the source region 150 and the shielding electrode 182 through the first conductive plugs 192a~192c passed through the interlayer dielectric layer 190, and the gate conductive layer 200G electrically connects to the gate electrode 172 through the plurality of second conductive plugs 194 passed through the interlayer dielectric layer 190.

In other words, the source conductive layer 200S and the gate conductive layer 200G may serve as the source pad and the gate pad of the double gate trench power transistor 1 for electrically connecting to an external controlling circuit. The materials for forming the source conducting layer 200S and the gate conductive layer 200G may be titanium (Ti), titanium nitride (TiN), tungsten (W), aluminum silicon alloy (Al—Si) or aluminum silicon copper alloy (Al—Si—Cu). However, the instant disclosure is not limited thereto.

Figure 2:
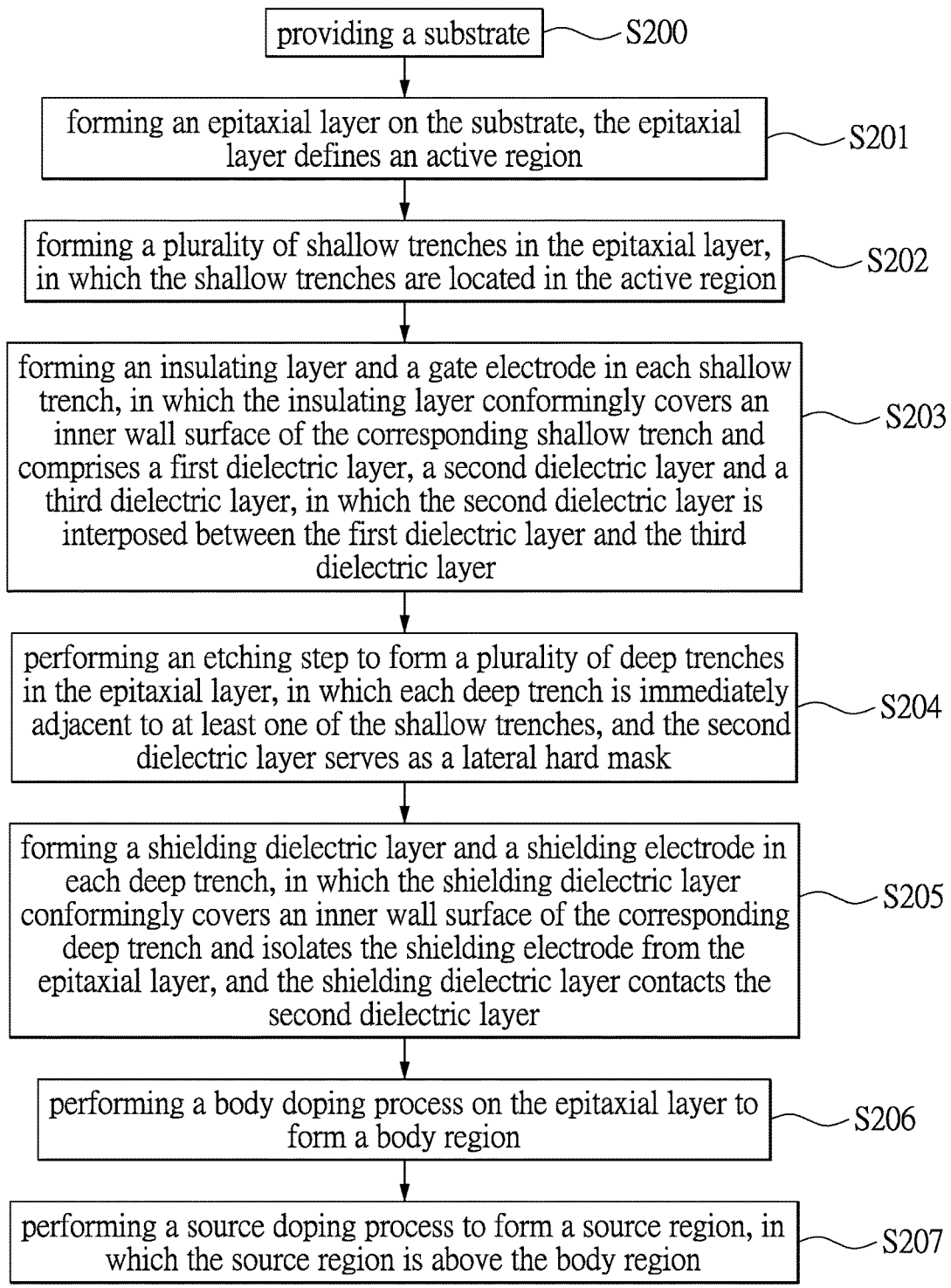
FIG. 2 is a manufacturing procedure diagram of a double gate trench power transistor of an embodiment of the instant disclosure.

Next, the embodiment of the instant disclosure provides the manufacturing process of the double gate trench power transistor. Please refer to FIG. 2. FIG. 2 is a manufacturing procedure diagram of a double gate trench power transistor of an embodiment of the instant disclosure. In addition, please refer to FIG. 3A to FIG. 3H. FIG. 3A to FIG. 3H are the partial sectional schematic views of each step of the manufacturing process of a double gate trench power transistor of an embodiment of the instant disclosure.

Figure 3A:
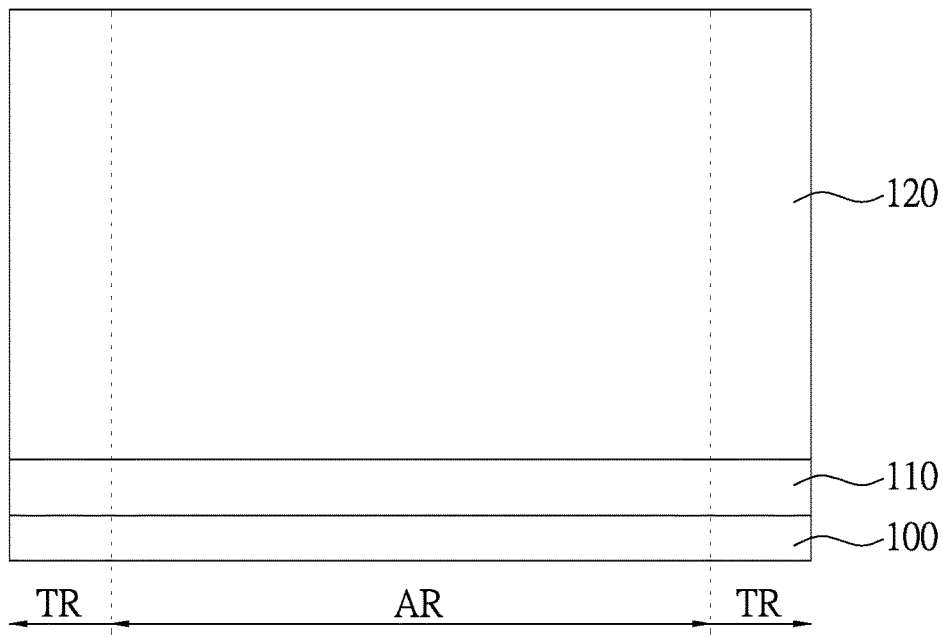
FIG. 3A to FIG. 3H are the partial sectional schematic views of each step of the manufacturing process of a double gate trench power transistor of an embodiment of the instant disclosure.
Figure 3B:
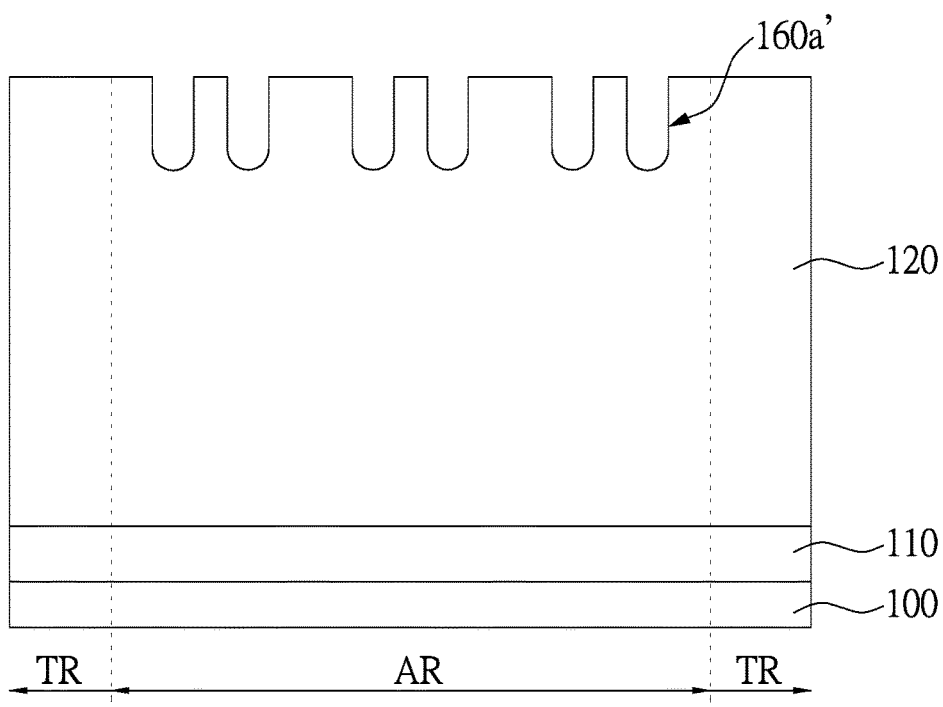

First, please refer to FIG. 2. In step S200, providing a substrate. Next, in step S201, forming an epitaxial layer on the substrate, the epitaxial layer defines an active region. Please refer to FIG. 3A. FIG. 3A shows the substrate 100, and an epitaxial layer 120 is formed on the substrate 100, in which the substrate 100 is, for example, a silicon substrate and has a first heavily doped region with high doping concentration as the drain of the trench power transistor. The epitaxial layer 200 has a low doping concentration.

In the present embodiment, before the step of forming the epitaxial layer 120 on the substrate 100, the method further comprises forming a buffer layer 110 on the substrate 100. As shown in FIG. 3A, the buffer layer is formed between the substrate 100 and the epitaxial layer 120. In addition, the buffer layer 110 has a conductive type the same as the substrate 100 and the epitaxial layer 120, but the doping concentration of the buffer layer 110 is between the doping concentration of the substrate 100 and the doping concentration of the epitaxial layer 120. Furthermore, in the present embodiment, the epitaxial layer 120 defines an active region AR and a termination region TR therein.

Please refer to FIG. 2 again, in step S202, forming a plurality of shallow trenches in the epitaxial layer, in which the shallow trenches are located in the active region. Please refer to FIG. 3B. A plurality of shallow trenches 160a' form in the epitaxial layer 120, and the depths of the shallow trenches 160a' are from about 0.8 to 1.3 µm.

In an embodiment, a mask (not shown) is first utilized for defining the positions of the plurality of shallow trenches 160a', and the plurality of shallow trenches 160a' are formed in the epitaxial layer 120 by dry etching or wet etching.

Next, please refer to FIG. 2 again. In step S203, forming an insulating layer and a gate electrode in each shallow trench, in which the insulating layer conformingly covers an inner wall surface of the corresponding shallow trench and comprises a first dielectric layer, a second dielectric layer and a third dielectric layer, in which the second dielectric layer is interposed between the first dielectric layer and the third dielectric layer.

Figure 3C:
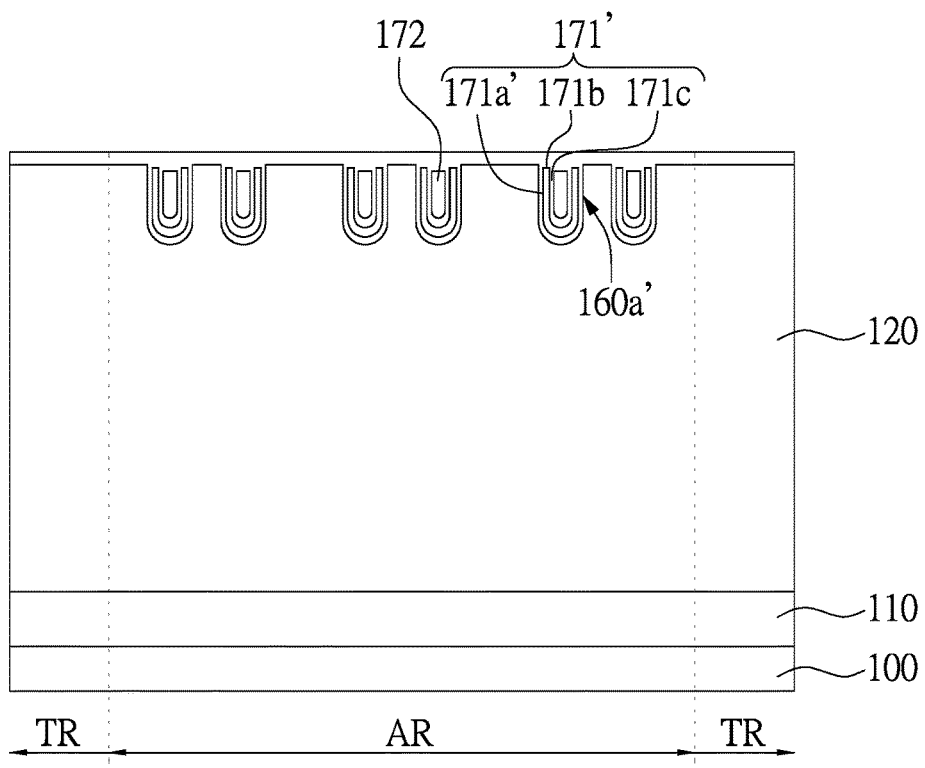

Please refer to FIG. 3C. To be specific, the step comprises sequentially forming a first dielectric layer 171a', a second dielectric layer 171b and a third dielectric layer 171c in the inner walls (including two side walls and the bottom wall) of each shallow trench 160a'. The material for forming the first dielectric layer 171a' may be an oxide layer or a nitride layer. For example, the first dielectric layer 171a' is a silicon oxide layer ($SiO_x$), and is formed by a thermo oxidation process. In another embodiment, the first dielectric layer 171a' may be formed by physical vapor deposition or chemical vapor deposition.

In an embodiment, the dielectric constant of the second dielectric layer 171b is higher than the dielectric constant of the first dielectric layer 171a', and the second dielectric layer 171b serves as a lateral hard mask in the following procedure. For example, if the first dielectric layer 171a' is silicon oxide, the second dielectric layer 171b may be a nitride such as silicon nitride, and is conformingly covered on the first dielectric layer 171a' by physical vapor deposition or chemical vapor deposition.

The third dielectric layer 171c may be chosen from an oxide or a nitride such as silicon oxide ($SiO_2$), but is not limited thereto. In addition, the process for depositing the third dielectric layer 171c may be selected based on the chosen material and the actual need, for example, by physical vapor deposition or chemical vapor deposition process.

In an embodiment, the thickness of the first dielectric layer 171a' is from 10 to 35 nm, the thickness of the second dielectric layer 171b is from 20 to 30 nm, and the thickness of the third dielectric layer 171c is from 7 to 10 nm.

After completing the depositions of the first to third dielectric layers 171a', 171b, 171c, the insulating layer 171' defines recesses (not symbolized) in each shallow trench 160a'. Next, blanketly forming a first polycrystalline silicon structure on the third dielectric layer 171c and filling the recess (not symbolized) defined by the insulating layer 171'. The first polycrystalline structure may be a doped poly-Si. Next, removing the first polycrystalline silicon covered on the epitaxial layer 120 and a small part of the first polycrystalline silicon structure formed in the shallow trench 160a' by etching back, and forming the gate electrode 172 in the shallow trench 160a'.

Next, please refer to FIG. 2. In the step S204, performing an etching step to form a plurality of deep trenches in the epitaxial layer, in which each deep trench is immediately adjacent to at least one of the shallow trenches, and the second dielectric layer serves as a lateral hard mask. The manufacturing process of the double gate trench power transistor provided by the instant embodiment further comprises forming the terminal trench in the epitaxial layer 120 during the formation of the deep trench.

Figure 3D:
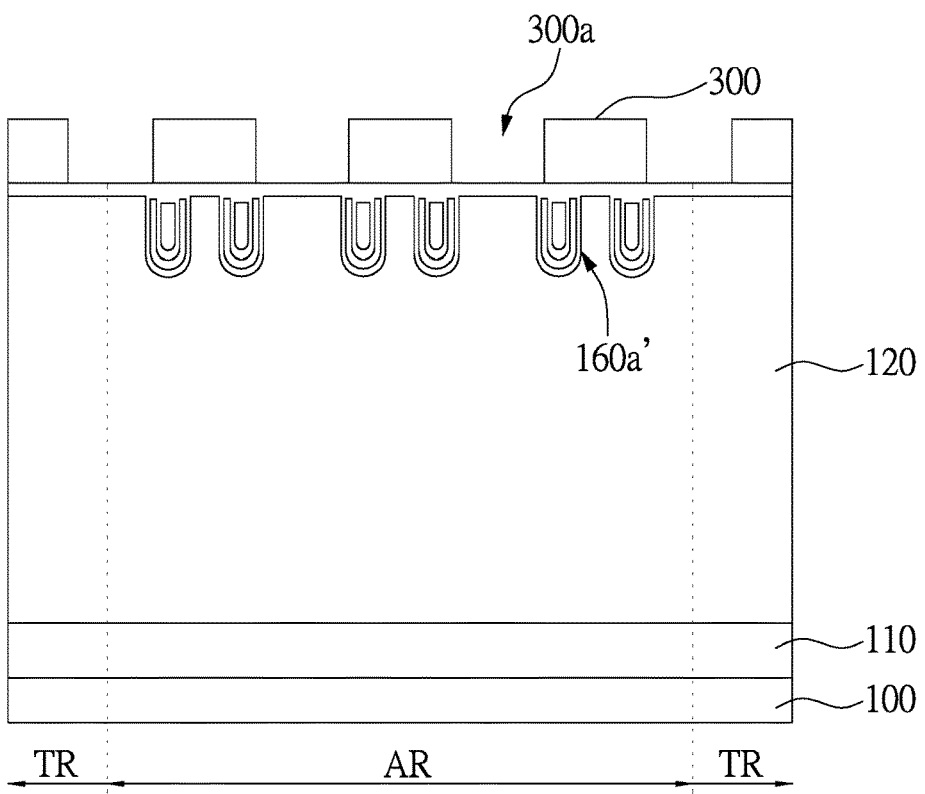
Figure 3E:
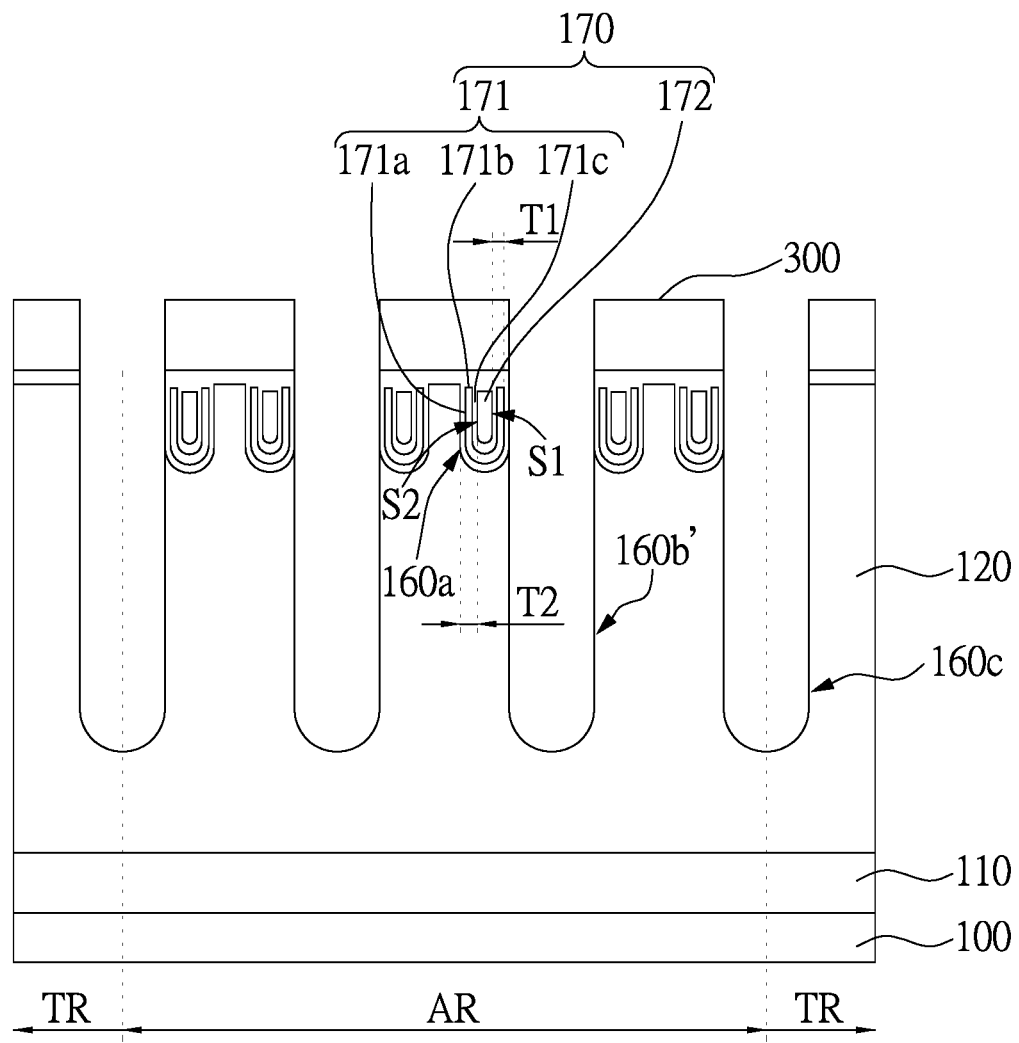

Please refer to FIG. 3D to 3E for detailed description. As shown in FIG. 3D, forming a photoresist layer 300 on the epitaxial layer 120, in which the photoresist layer 300 covers the shallow trench 160a' formed in the active region AR. In addition, the photoresist layer 300 has a plurality of openings 300a to define the predetermined position for forming the deep trench 160b' in the active region AR respectively, and the predetermined position for forming the terminal trench 160c in the termination region TR.

Next, please still refer to FIG. 3, forming the deep trench 160b' and the terminal trench 160c in the epitaxial layer 120 by dry etching or wet etching. As shown in FIG. 3E, the deep trench 160b' is formed in the active region AR, and the terminal trench 160c is formed in the termination region TR.

It is worthwhile to mention that the depth of the deep trench 160b' and the terminal trench 160c is from 2 to 5 µm. Since the deep trench 160b' and the terminal trench 160c would be at least directly adjacent to at least one of the shallow trenches 160a', while forming the deep trench 160b' by etching the epitaxial layer 120, a part of the insulating layer 171' formed in the shallow trenches 160a' would be removed as well. Specifically, a part of the first dielectric layer 171a in the shallow trenches 160a' and near to the deep trench 160b' may be completely removed due to its smaller thickness.

However, the second dielectric layer 171b in the insulating layer 171' may serve as a lateral hard mask during the etching step, thereby protecting the gate electrode 172 and the third dielectric layer 171c from being etched during the formation of the deep trench 160b', and ensuring the deep trench 160b' forms between the two shallow trenches 160a', resulting in a more symmetrical trench structure.

Accordingly, the thickness t1 of the gate insulating layer 171 that contacts the first side S1 (i.e., the side of the gate electrode 172 that is closer to the deep trench 160b') of the gate electrode 172 is smaller than the thickness t2 of the gate insulating layer 171 that contacts the second side S2 (i.e., the side of the gate electrode 172 that is far from the deep trench 160b') of the gate electrode 172.

Next, please refer to FIG. 2 again. In step S205, forming a shielding dielectric layer and a shielding electrode in each deep trench, in which the shielding dielectric layer conformingly covers an inner wall surface of the corresponding deep trench and isolates the shielding electrode from the epitaxial layer, and the shielding dielectric layer contacts the second dielectric layer.

In the embodiment of the instant disclosure, during the step of forming the dielectric layers, the terminal dielectric layer may be formed in the terminal trench at the same time; and during the step of forming the shielding electrode, the terminal electrode may be formed in the terminal trench at the same time.

Figure 3F:
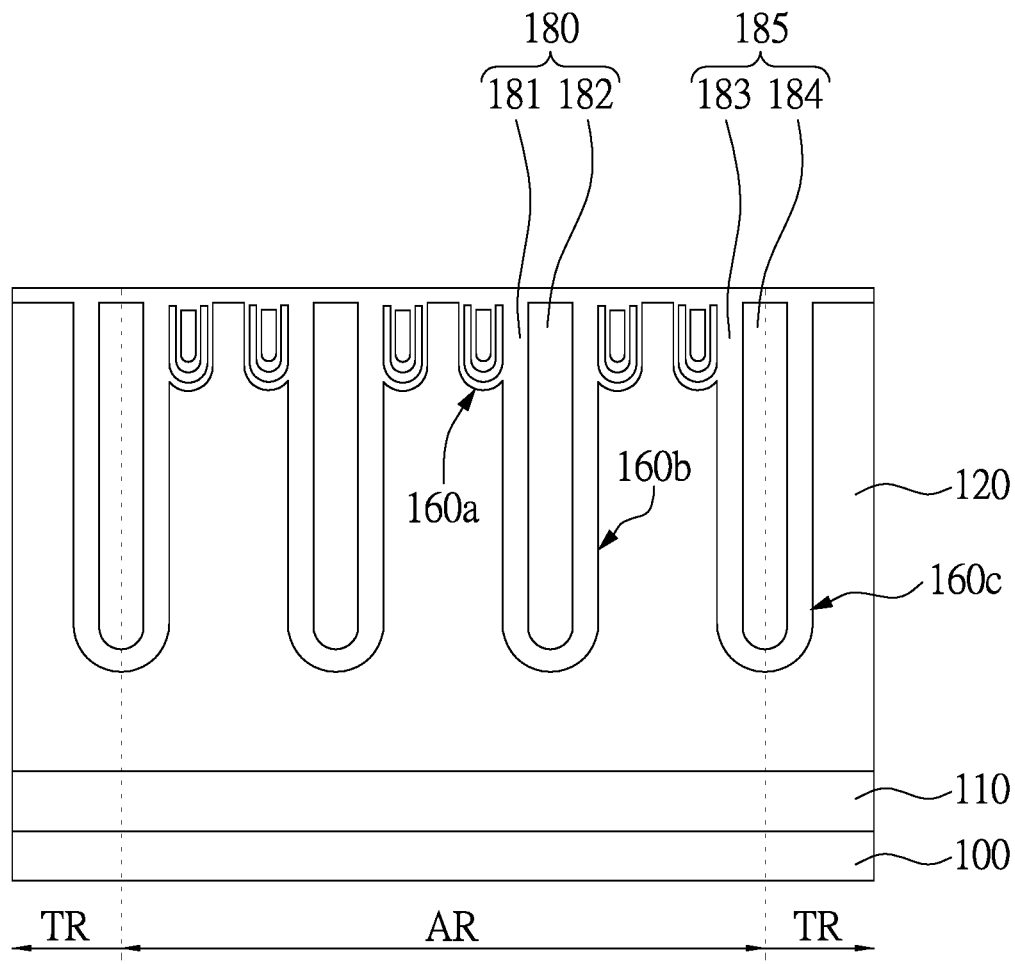

Please refer to FIG. 3F for detailed description. In an embodiment, the detailed steps for forming the shielding electrode structure 180 and the terminal electrode structure 185 are described herein. First, forming the insulating material on the inner walls of the deep trench 160b' and the terminal trench 160c by thermo oxidation process, chemical vapor deposition process or physical vapor deposition process to form the shielding dielectric layer 181 and the terminal dielectric layer 183 in the deep trench 160b' and the terminal trench 160c respectively.

It is worthwhile to mention that since in the previous etching step, a part of the first dielectric layer 171a formed in the shallow trench 160a' and near to the deep trench 160b' has been removed, the shielding dielectric layer 181 would directly contact the second dielectric layer 171b.

Subsequently, forming a second polycrystalline silicon structure on the surface of the epitaxial layer 120 and filling into the deep trench 160b' and the terminal trench 160c. Next, removing the second polycrystalline silicon structure formed on the surface of the epitaxial layer 120 by etching back and leaving the second polycrystalline silicon structure formed in the deep trench 160b' and the terminal trench 160c to form the shielding electrode 182 and the terminal electrode 184 in the deep trench 160b' and terminal trench 160c respectively. The process for forming the second polycrystalline silicon structure may be the same as the process for forming the first polycrystalline silicon structure, and will not be discussed in detail herein.

Please refer to FIG. 2 again. Performing step S206 and S207. In step S206, performing a body doping process on the epitaxial layer to form a body region. In step S207, performing a source doping process to form a source region, in which the source region is above the body region.

Figure 3G:
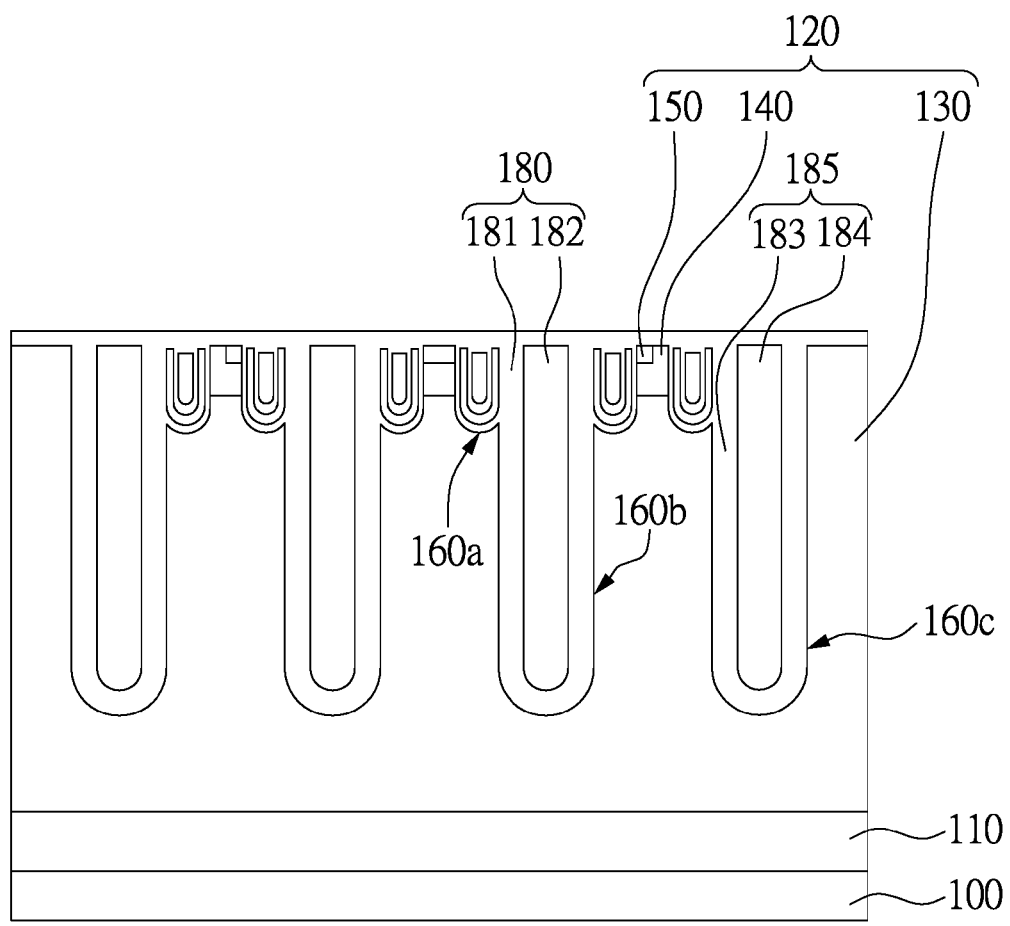

Please refer to FIG. 3G. After performing a body doping process on the epitaxial layer 120, forming a first doping region on a side of the epitaxial layer 120 that is far from the substrate 100. After forming the first doping region, performing a source doping process on the first doping region to form a source region 150 and a body region 140. It is worthwhile to mention that the source doping process may include performing a thermo diffusion process after performing ion implementation on the first doping region, in order to form the source region 150. In addition, as shown in FIG. 3G, in the present embodiment, the lowest edge of the body region 140 is higher than the horizontal position of the bottom surface of the gate electrode 172.

The manufacturing method of the double gate trench power transistor provided by the embodiment of the instant disclosure may further comprise forming a circuit redistribution layer on the epitaxial layer 120 to enable the source region 150, the gate electrode 172, the shielding electrode 182 and the terminal electrode 184 to electrically connect to the external controlling circuit. Taking the formation of the first contact plugs 192a~192c and the source conductive layer 200S shown in FIG. 1B as an example, the specific steps for forming the circuit redistribution layer are described below.

Figure 3H:
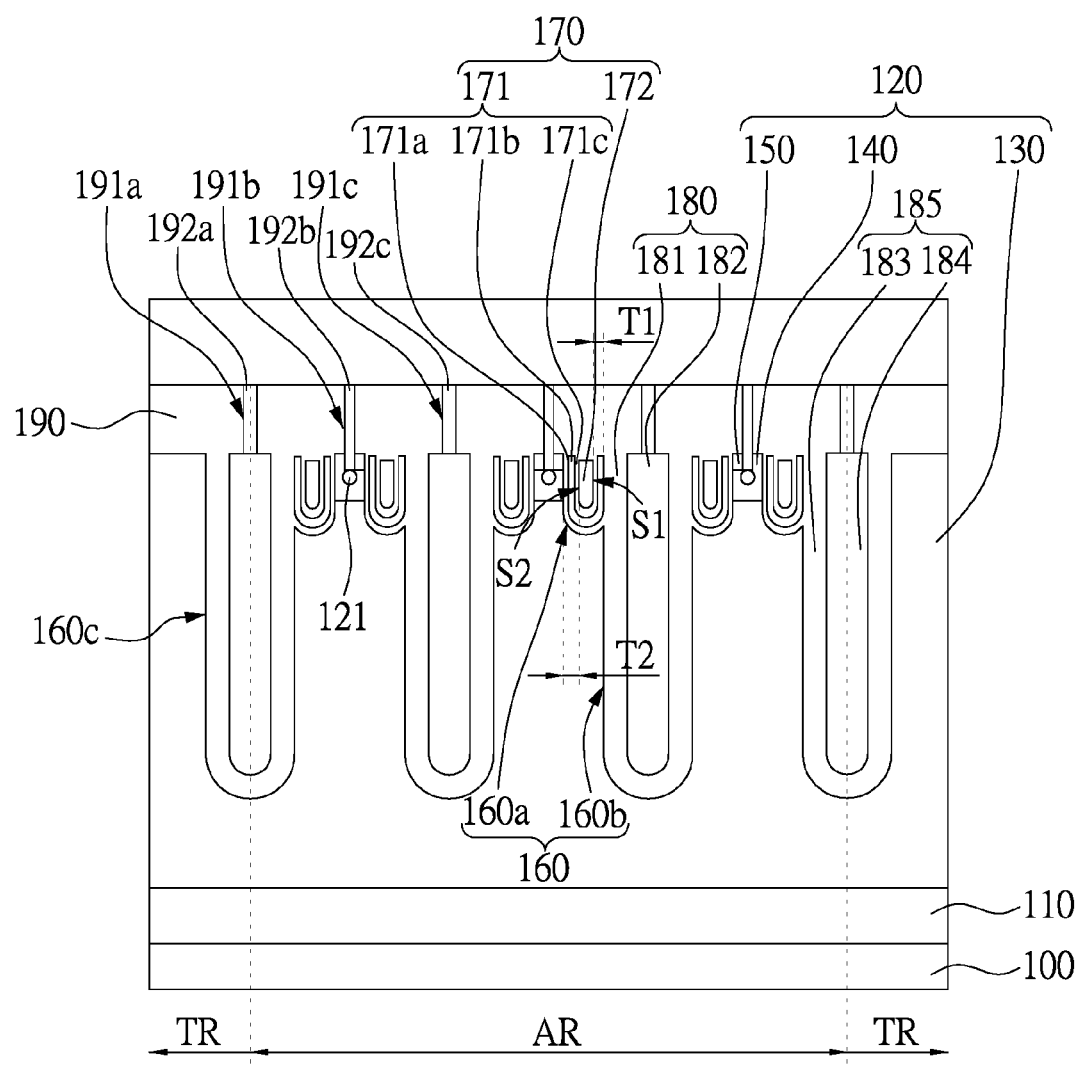

Please refer to FIG. 3H. Forming an interlayer dielectric layer 190 to entirely cover the surface of the epitaxial layer 120, the gate structure 170, the shielding electrode structure 180 and the terminal electrode structure 185. The material for forming the interlayer dielectric layer 190 may be selected from the group consisting of boron phosphorus silicon glass (BPSG), phosphorus silicon glass (PSG), oxides, nitrides or the combination thereof.

Subsequently, forming a plurality of first contact openings 191a~191c corresponding to the terminal electrode 184, the source region 150 and the shielding electrode 182 respectively. In the present embodiment, the process for forming the first contact openings 191a~191c may be performed by well-known techniques such as photoresist coating, lithography and etching.

Next, forming a plurality of first conductive plugs 192a~192c in the corresponding first contact openings 191a~191c. It is worthwhile to mention that after the first conductive plugs 192a~192c pass through the interlayer dielectric layer 190, it extends into the terminal electrode 184, the epitaxial layer 120 and the shielding electrode 182 to electrically connect to the terminal electrode 184, the epitaxial layer 120 and the shielding electrode 182 respectively.

It is worthwhile to mention that before forming the plurality of first conductive plugs 192a~192c, a doping process on the epitaxial layer 120 via the first contact opening 191b to form a contact doping region 121 in the epitaxial layer 120 under the first contact opening 191b can be performed. In an embodiment, the dopant doped in the contact doping region 121 is boron difluoride ($BF_2$).

In addition, after forming the first conductive plugs 192a~192c in the corresponded first contact openings 191a~191c, the instant disclosure may further comprise forming a source conductive layer 200S covering the interlayer dielectric layer 190. The source conductive layer 200S may electrically connect to the terminal electrode 184, the source region 150 and the shielding electrode 182 through the first conductive plugs 192a~192c respectively. The source conductive layer 200S may be formed by titanium (Ti), titanium nitride (TiN), tungsten (W), aluminum silicon alloy (Al—Si) or aluminum silicon copper alloy (Al—Si—Cu). However, the instant disclosure is not limited thereto.

Based on the above description, those skilled in the art are able to derive or achieve other practical details and hence, the other details are not described herein. Furthermore, the steps for forming the second contact plugs 194 and the gate conductive layer 200S as shown in FIG. 1C are similar to that of the previous embodiment. Specifically, in the step of forming a plurality of first contact openings 191a~191c in the interlayer dielectric layer 190, a plurality of contact openings 193 are able to be formed at the same time. In the step of forming a plurality of first conductive plugs 192a~192c, corresponding second conductive plugs 194 in each second contact opening 193 are able to be formed at the same time. Furthermore, in the step of forming the source conductive layer 200S, the gate conductive layer 200G is able to be formed.

In summary, since in the manufacturing method of the double gate trench power transistor provided by the embodiment of the instant disclosure, the gate electrode and the shielding electrode are isolated from each other by a thicker shielding dielectric layer and a part of gate insulating layer, the capacitance generated between the gate electrode and the shielding electrode may be relatively reduced. In addition, in the manufacturing method provided by the embodiment of the instant disclosure, the gate electrode is less likely to form a point portion that accumulates electric charge, thereby improving the electrical performance of the double gate trench power transistor.

In addition, during the process for performing the etching step to form the deep trench, the second dielectric layer in the gate insulating layer may serve as the lateral hard mask in the etching step to protect the gate electrode and the third dielectric layer from being etched during the procedure of forming the deep trench, and to ensure that the deep trench is formed between the two shallow trenches, thereby forming a more symmetrical trench structure.

The above-mentioned descriptions represent merely the exemplary embodiment of the instant disclosure, without any intention to limit the scope of the present disclosure thereto. Various equivalent changes, alternations or modifications based on the claims of the instant disclosure are all consequently viewed as being embraced by the scope of the present disclosure.

What is claimed is:

1. A double gate trench power transistor, comprising:
   a substrate;
   an epitaxial layer formed on the substrate, wherein the epitaxial layer defines at least an active region and has a trench structure formed in the active region, and the trench structure comprises a deep trench portion and two shallow trench portions adjacent to two opposite sides of the deep trench portion respectively;
   two gate structures formed in the shallow trench portions respectively, wherein each gate structure comprises a gate insulating layer and a gate electrode, the gate insulating layer conformingly covers an inner wall surface of the corresponding shallow trench portion to insulate the gate electrode from the epitaxial layer, and the gate insulating layer comprises a first dielectric layer, a second dielectric layer and a third dielectric layer, the second dielectric layer is interposed between the first dielectric layer and the third dielectric layer;
   a shielding electrode structure formed in the deep trench portion, the shielding electrode structure comprises a shielding dielectric layer and a shielding electrode, the shielding dielectric layer conformingly covers an inner wall surface of the deep trench portion to insulate the shielding electrode from the epitaxial layer, and a part of the shielding dielectric layer positioned at two opposite sides of the shielding electrode contacts the gate insulating layers positioned in the shallow trench portions, wherein the gate electrode has a first side immediately near to the shielding electrode and a second side opposite to the first side, wherein the gate insulating layer that contacts the first side has a thickness less than the thickness of the gate insulating layer that contacts the second side;
   a body region formed in the epitaxial layer and surrounding the gate structures; and
   a source region formed above the body region.

2. The double gate trench power transistor according to claim 1, wherein the epitaxial layer defines a termination region and the epitaxial layer comprises at least a terminal trench formed in the termination region, and the double gate trench power transistor further comprises at least a terminal electrode structure formed in the terminal trench, wherein the terminal electrode structure comprises:
   a terminal electrode positioned in the terminal trench; and
   a terminal dielectric layer conformingly covered an inner wall surface of the terminal trench to isolate the terminal electrode from the epitaxial layer.

3. The double gate trench power transistor according to claim 2, wherein the terminal electrode surrounds the active region.

4. The double gate trench power transistor according to claim 1, wherein the part of the shielding dielectric layer directly contacts with the second dielectric layer of each gate insulating layer.

5. The double gate trench power transistor according to claim 1, wherein the first dielectric layer has a thickness of from 10 to 35 nm, the second dielectric layer has a thickness of from 20 to 30 nm, and the third dielectric layer has a thickness of from 7 to 10 nm.

6. The double gate trench power transistor according to claim 1, wherein the second dielectric layer is formed by a nitride layer.

7. The double gate trench power transistor according to claim 1, further comprising:
   an interlayer dielectric layer formed on the epitaxial layer, wherein the interlayer dielectric layer has a plurality of first contact openings and a plurality of second contact openings, the first contact openings expose the source region and the shielding electrode, the second contact openings expose the gate electrodes respectively;
   a plurality of first conductive plugs formed in the first contact openings respectively to electrically connect the source region and the shielding electrode; and
   a plurality of second conductive plugs formed in the second contact openings to electrically connect to the gate electrodes respectively.

8. A double gate trench power transistor, comprising:
   a substrate;
   an epitaxial layer formed on the substrate, wherein the epitaxial layer defines at least an active region and has a trench structure formed in the active region, and the trench structure comprises a deep trench portion and two shallow trench portions adjacent to two opposite sides of the deep trench portion respectively;
   two gate structures formed in the shallow trench portions respectively, wherein each gate structure comprises a gate insulating layer and a gate electrode, the gate insulating layer conformingly covers an inner wall surface of the corresponding shallow trench portion to insulate the gate electrode from the epitaxial layer, and the gate insulating layer comprises a first dielectric layer, a second dielectric layer and a third dielectric layer, the second dielectric layer is interposed between the first dielectric layer and the third dielectric layer; and
   a shielding electrode structure formed in the deep trench portion, the shielding electrode structure comprises a shielding dielectric layer and a shielding electrode, the shielding dielectric layer conformingly covers an inner wall surface of the deep trench portion to insulate the shielding electrode from the epitaxial layer, and a part of the shielding dielectric layer positioned at two opposite sides of the shielding electrode contacts the gate insulating layers positioned in the shallow trench portions;
   an interlayer dielectric layer formed on the epitaxial layer, wherein the interlayer dielectric layer has a plurality of first contact openings and a plurality of second contact openings, the first contact openings expose the source region and the shielding electrode, the second contact openings expose the gate electrodes respectively;
   a plurality of first conductive plugs formed in the first contact openings respectively to electrically connect the source region and the shielding electrode; and
   a plurality of second conductive plugs formed in the second contact openings to electrically connect to the gate electrodes respectively.

* * * * *